(12) United States Patent
Caldwell

(10) Patent No.: US 6,573,767 B1
(45) Date of Patent: Jun. 3, 2003

(54) POWER GROUND SHORT CIRCUIT, WITH ADJUSTABLE ACTIVATION DELAY AND ACTIVATION TIME PERIOD

(75) Inventor: Barry Caldwell, Hesston, KS (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/975,337

(22) Filed: Oct. 11, 2001

(51) Int. Cl.[7] .............................. H03L 7/00; H03K 3/02
(52) U.S. Cl. ....................................... 327/143; 327/198
(58) Field of Search ................................. 324/416, 522, 324/509, 42, 52, 86, 88; 323/234; 702/87; 327/141, 143, 149, 198; 365/226, 228, 229; 713/300; 714/14

(56) References Cited

U.S. PATENT DOCUMENTS 5,432,386 A * 7/1995 Cerra et al. .................... 307/66
5,883,501 A * 3/1999 Arakawa ...................... 323/222
6,151,529 A * 11/2000 Batko ........................... 700/28
6,329,851 B1 * 12/2001 Murphy ....................... 327/143

* cited by examiner

Primary Examiner—N. Le
Assistant Examiner—Donald M Lair
(74) Attorney, Agent, or Firm—Suiter & Associates PC

(57) ABSTRACT

A power ground short circuit with adjustable activation delay and activation time period eliminates latent voltages in the power down/ off discharging circuitry. The circuit uses an internal back up power storage device to supply power on power down. A comparator determines when the power down condition occurs. Two timers are used to generate an activation signal for a charge pump. The charge pump is responsible for turning on a pair of transistors which bring the power bus voltage down to a zero level. A slew rate detector enables the comparator.

42 Claims, 2 Drawing Sheets

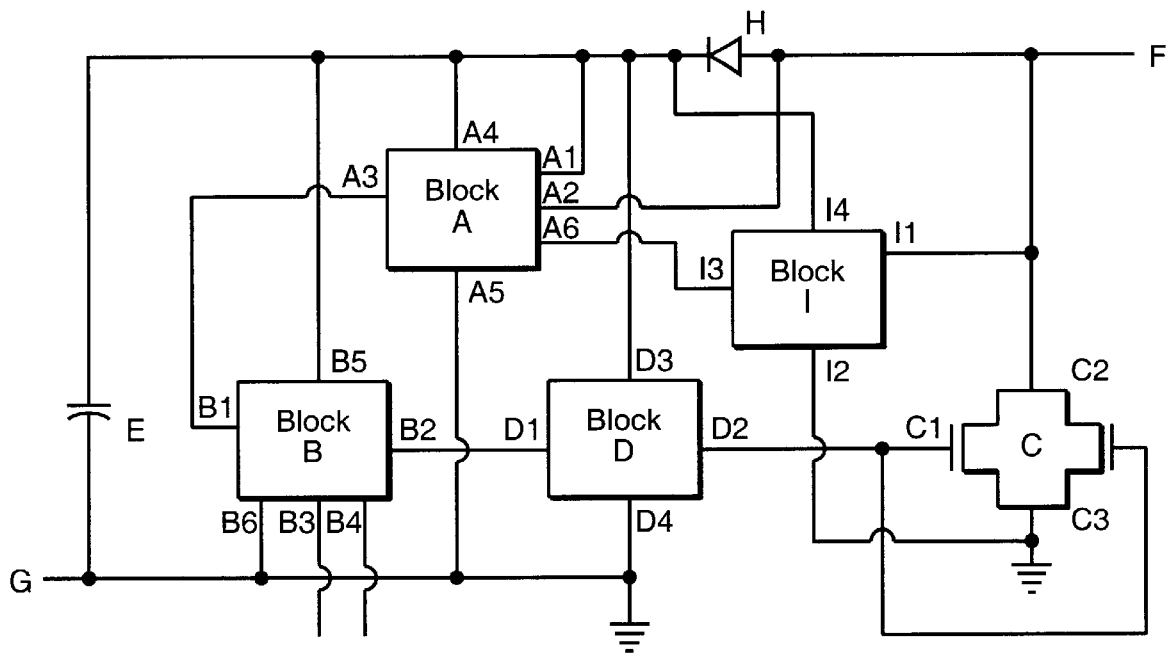
FIG._1
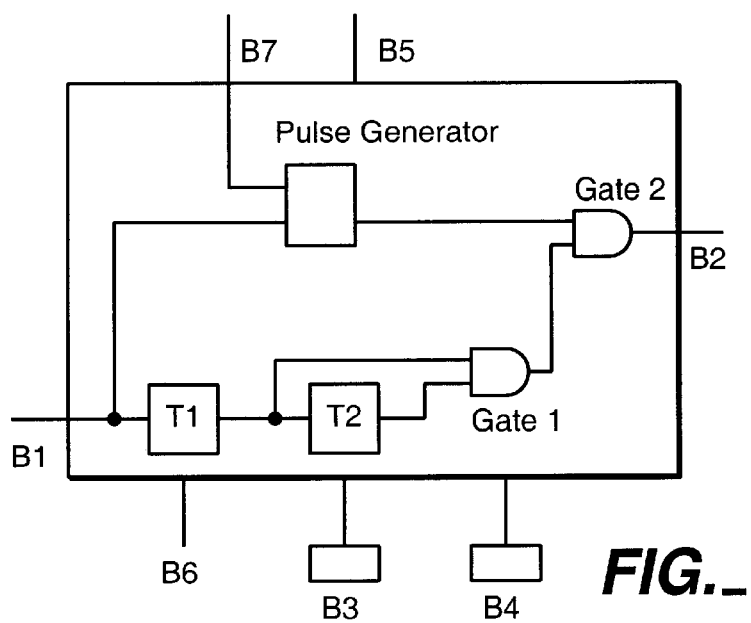
FIG._2

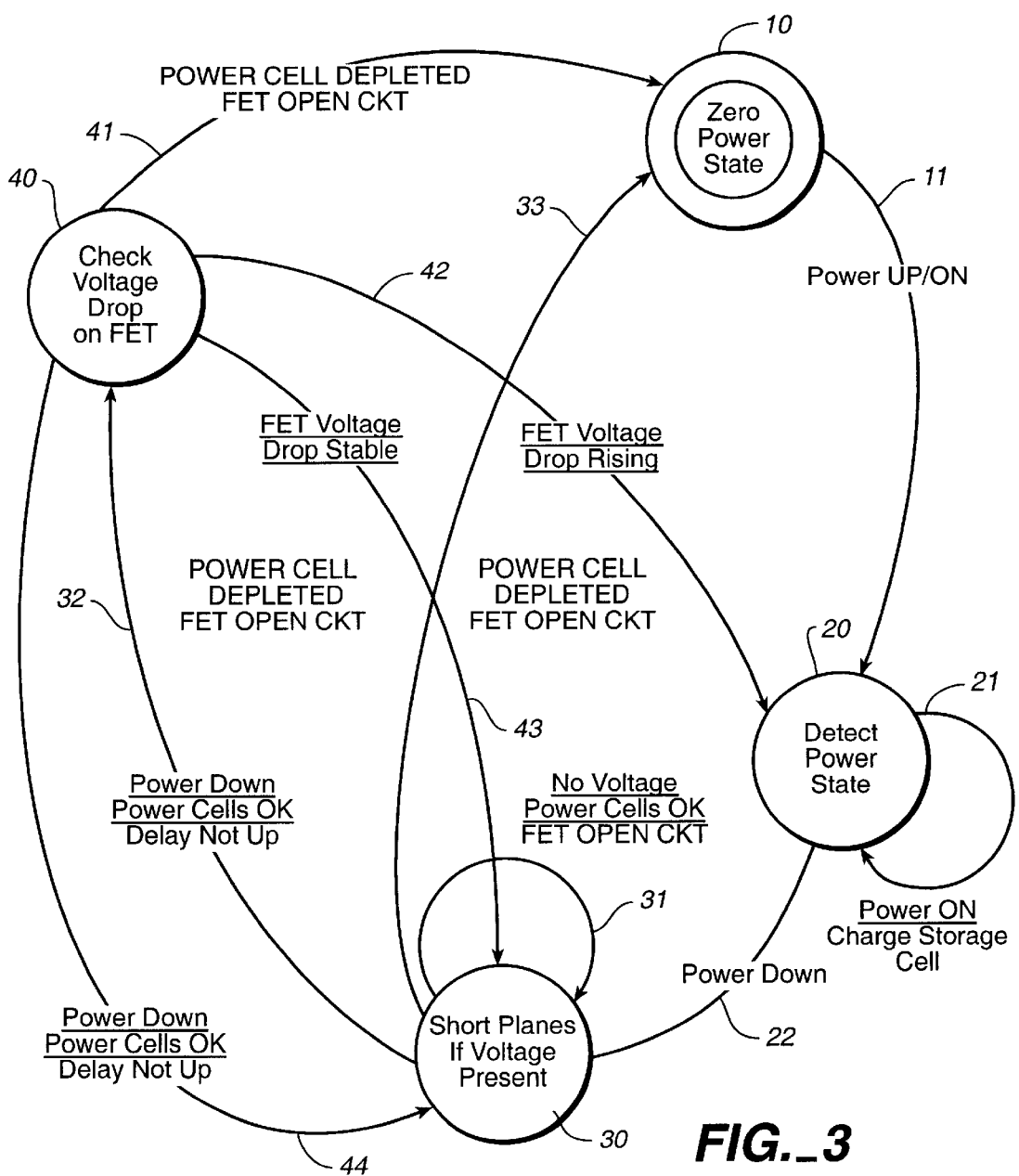
FIG._3

POWER GROUND SHORT CIRCUIT, WITH ADJUSTABLE ACTIVATION DELAY AND ACTIVATION TIME PERIOD

FIELD OF THE INVENTION

The present invention generally relates to the field of a detector circuit, and particularly to power down detecting and voltage zeroing circuits.

BACKGROUND OF THE INVENTION

A problem in many integrated circuits is the elimination of latent voltages in the power-down state. There are many functions which may be needed to perform at initial power-down such as storing critical data.

This is particularly useful for server class computer systems, RAID (redundant array of independent disks) systems that sense voltage and power levels in cluster modules before re-powering, and battery-backed or battery operated integrated circuits, which may be used to perform power-management or nonvolatizing functions for an electronic system. If the power bus is not properly discharged, spurious data may be created and erroneous commands to the system may be issued. Thus, a great many types of systems and integrated circuits include a power-on-reset circuit to detect when power is applied after a power-down condition.

A power-on-reset (POR) cell is a circuit that outputs a logical "1" or "0" signal when the power supply voltage, the input to the POR, has reached a sufficient, valid level. The POR output switches to a logical "1" or "0" for a determined time when the supply voltage reaches a predetermined voltage level, returning to a non-active logic state after the determined time. A POR cell is useful because many circuits require the application of a master reset signal only after the supply voltage reaches a valid signal. When the supply voltage reaches a valid level, the master reset signal can start all clocks and bring the active elements of a system to a known state so that proper operation can begin.

One problem in POR circuits is power cycling. Power cycling involves turning the supply on and off repeatedly, for example, while remaining as little as 1 microsecond in each state (on or off). Power cycling can occur due to system glitches resulting from noise or mechanical system problems. It is important that during a power off or power down, the associated problematic latent voltages are eliminated.

Therefore, it would be desirable to provide a way to short power and ground planes on computer boards to the same potential, i.e., power-on-zero volts (POZ), so power-on-reset (POR) will work correctly.

SUMMARY OF THE INVENTION

Accordingly, the present invention is directed to a power-ground shorting circuit. In a first aspect of the present invention, a circuit senses when a computer board powers down and then shorts the power and ground planes together to remove latent voltage on the voltage or power plane relative to the ground plane with a controlled short time period and delay to activation time period. This allows the elimination of spurious voltage levels that might damage circuitry.

The present invention relates to a circuit for powering down a power line or plane, comprising a comparator for comparing the voltage on the power line with an internal reference voltage to provide a comparator output signal, a delay circuit receiving the comparator output signal and generating a delay circuit output signal, a booster circuit for providing a booster circuit output signal greater in magnitude than the magnitude of the delay circuit output signal if needed to activate the switching circuit; and a switching circuit which is activated by the booster circuit output signal so as to eliminate latent voltages on the power line or plane.

The present invention relates to a method of shorting a power bus line or plane to ground, comprising the steps of comparing an internal reference voltage with the power bus line voltage, generating a power fault signal if the difference between the internal reference voltage and the power bus line voltage exceeds a threshold, generating a time delay signal as a result of the power fault signal, generating a signal as a result of the time delay signal, and activating a switch to drive the power bus line to ground.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 illustrates a power ground short circuit with adjustable activation delay and activation time period of a preferred embodiment;

FIG. 2 illustrates an exemplary embodiment of the delay or pulse block B; and

FIG. 3 is a state diagram describing operation of the Power-On-Zero (POZ) circuit of FIG. 1.

DETAILED DESCRIPTION OF THE INVENTION

Reference will now be made in detail to the presently preferred embodiment of the invention, an example of which is illustrated in the accompanying drawings.

Referring generally now to FIG. 1, an exemplary embodiment of the present invention is shown.

Computer chips can have leakage current, which in the powered down or off state can cause a system, whether one computer board or multiple boards interconnected, to have a back ground or imposed non-functional voltage level. This imposed voltage, if of a significant level above zero volts can cause many different erroneous and undesired functional actions in computer systems. One example is power-on-reset (POR) circuits used in chips to clear the functional elements inside chips to a known starting state. Computer boards and systems also use stand alone discrete PORs for the board or system.

It is critical to bring the power bus down to zero volts as closely as possible. The present invention zeroes the power bus line voltage so that a subsequent POR or voltage detect power on circuit works properly.

As shown in FIG. 1, the following circuit block diagram with blocks A to H illustrate the circuit's function of sensing a power off sequence, latent voltage, and shorting of power and ground structures to remove a voltage differential between the power planes/ structures of a singular power/ ground pair, multiple power/ ground pairs, singular ground/ multiple power, or singular power/ multiple ground planes/ structures.

The voltage/ power comparator block A compares a set internal reference voltage to the external board or system voltage to determine if the board or system has been powered down or up. Point A1 connects to an internal voltage reference. Point A2 connects to an external voltage sense point, either board or system. Point A3 generates a signal when the comparison of voltages of point A1 and point A2 indicates a power down/ off condition exists. Point A4 supplies power (input voltage) to the comparator. Point A5 supplies power return for the comparator. The comparator may be implemented through an off-the-shelf chip or an op amp circuit or other known means.

The delay block B is activated once the board/ system has powered down. Two delay timers are started. The first timer controls how long after the power off/ down occurs before the power/ power-return (ground) short/ interconnect is initiated. The second timer controls the period for how long the power/ power-return short/ interconnection is maintained. Point B1 is the enable for the delay circuit by starting the first timer and also enabling the second timer which starts at some point after the first timer starts. Point B2 is the enable for block D. Point B3 is the period set entry point. By using a resistor and capacitor (to establish an RC time constant) or digital delay circuit, the first timer's delay period can be set. Whether a resistor and capacitor or digital delay circuit is used would determine the physical circuit construction of the delay element inside of block B. Point B4 is the second period set entry point. By using a resistor and capacitor (to establish an RC time constant) or digital delay circuit, the first timer's delay period can be set. Whether a resistor and capacitor or digital delay circuit is used would determine the physical circuit construction of the delay element inside of block B. Point B5 is the power/ voltage connection to block B power circuit. Point B6 is the power return connection. The timers may be internal to the delay block. The timers may be implemented by one shot multistable vibrators. Point B7 sets the pulse width and spacing by impressing a voltage. By varying the width and spacing of the delay pulse, power saving is implemented. This feature, along with the pulse generator of block B, is optional.

FIG. 2 shows an alternative embodiment of an functional implementation of pulse block B which generates a programmable pulse width circuit. In block B, timer 1, T1, receives the enable from comparator block A. Thereupon, it generates a first signal which is input to Timer 2, T2, as well as digital gate logic. The circuit could range from ON to enable the circuit active period set by T1 and T2 to pulses of 1 microsecond in width that are one minute apart to pulses of 1 minute in width separated by one microsecond. The intent is to extend the operation time of the circuit in a power extended mode. In this state, the shorting component (FET (s) C generally) would be open except during the pulse active period which would range from one microsecond to one minute. This mode could be entered after the circuit reached a power reserve level of one half. The state diagram of FIG. 3 is the same for both embodiments of block B.

Connection FET(s) (field effect transistors) C are turned on or off by block D. When the FET(s) are in the conduction state, the power and power-return (ground) plane(s) are electrically equal to remove any latent voltage that might be leaked from the circuit components. Point C1 is at the gates of FET(s) which can be arranged in parallel. The electrical connection between point D2 of block D and point C1 of the gates of the FET(s) C permit block D to impress a turn on or off voltage on the gate depending on whether the FET(s) are in the conduction state (on) or the high impedance state (off). The redundancy in pairing FETs permits current load sharing and greater reliability in case one FET were to fail. Point C2 is connected to the sources of the transistors if they are PMOS or to the drains of the transistors if they are NMOS and connects to the internal reference voltage and a voltage detector (not shown). Point C3 of the FETs C is the drains of the FETs if they are PMOS or the sources of the FETs if they are NMOS. Point C3 connects to ground or power-return. Other implementations of the shorting switch could use solid-state relays or mechanical relays in single or multiple parallelisms.

Block D is the charge pump. A charge pump resembles a voltage multiplier in that it produces an output voltage up to several times the magnitude of its input signal. A charge pump behaves like a current source. Charge-pump ICs can either invert or double an input voltage. Used with a comparator and reference voltage, various outputs can be achieved; however, the charge pump doesn't regulate or easily boost the voltage of the output. Point D1 is the charge pump enable. Point D2 is the output of the charge pump. Point D3 is the power/ voltage connection to block D. Point D4 is the power-return/ ground for block D.

Block E is the internal charge store capacitor. This internal storage device provides power to the circuit when the chip, board, or system that is a part of it has gone into a power down or off state. The energy storage cell may be a capacitor storage cell or chemical energy storage cell, i.e., a battery. The energy storage cell could also be attached externally of the chip, board, or system.

Block F represents the voltage power bus. This connection supplies energy to the individual block elements for operational functions.

Block G represents the power return or ground bus. This connection is the energy return connection, commonly called ground. It is equal to zero volts and provides a current return connection to the system ground or power return.

Block H is the blocking diode. When the system, chip, or board loses external power, the internal power source block E provides power to the system, chip, or board.

Block I detects voltage slewing; that is, voltage increases, voltage decreases, or no change in a hysteresis loop. The output of Block I enables the comparator block A when slewing down and stable after slew down or power off. Point I1 is connected to power bus F. Point I2 is connected to ground at FET(s) C. Point I3 provides an enable to voltage comparator block A. Point I4 receives power from the internal power source E or, when operational, power bus F through blocking diode H.

In operation, an external power supply voltage F is used to run the circuit of FIG. 1. The internal voltage source is isolated from the voltage produced by the external power bus by blocking diode H. The power ground short circuit of the invention uses the slew rate block I to monitor power. When slew rate block I detects a power drop or no power change, it enables voltage/ power comparator block A to look for a fault has occurred on the power supply. This arrangement of blocks I and A helps prevent a glitchy power bus from falsely triggering the voltage zeroing circuitry. In a normal condition with the power supplied externally through power bus F, point A4 should have a magnitude less than the external power bus voltage F by the amount of voltage drop across blocking diode H.

In a power off or power down condition, the block A will issue a fault signal to the delay block B. This fault signal will trigger the first timer, then the second timer after a propagation delay. The initiation of the first timer and then the second timer will generate an enable which is provided to the charge pump block D at point D1. A further circuit may be added to block B to cycle the short on and off at a set period during the time period the short cycle is activated.

The charge pump output D2 can provide a boosted enable signal or digital level signal to the gates of FET(s) "C". Since the gate-to-drain or gate-to-source capacitance of FET(s) "C" must be charged in order for the gate voltage to rise to conduction levels, this process is essentially a capacitor charging operation to the desired volts. The gate is left charged to desired volts for a predetermined time and then discharged and left in an uncharged condition for a predetermined time. During this time, the FET(s) "C" conducts and causes power to be shorted to ground to eliminate latent voltages in the circuit.

During the course of the power down or off condition, voltage is supplied internally by block E, a stored energy source.

A low stored energy source detection circuit, such as a battery energy level detect circuit, may be added to check the condition of block E. This could entail using a comparator to determine a low battery condition such as when the external voltage has failed and the battery pack has been exhausted below a viable operating threshold. When the external power supply bus drops below its acceptable operating voltage, battery backup is enabled. The determination of such a condition would be transmitted to an external processor or indicated by a warning light or alarm.

FIG. 3 shows a state flow diagram of the operation of the preferred embodiment of the circuit. Starting from the zero power state node 10, on power up or on 11, the power state 20 is detected. While the power is on, the charge storage cell E can be charged 21. When power goes down 22, the power and ground planes are shorted to each other 30. When no latent voltage is detected on the power line, the FETs are open circuited or turned off and the energy storage cell is checked for valid power levels, 31. When Timer 1 and Timer 2 are both active, the energy storage cell is OK and the system power is still off, 32, then, the voltage drop across the FET is checked for power on-off by the slew rate detector block I, 40, and the power planes remain shorted, 44. If at any time the charge storage cell E is depleted, the operation returns to the zero power state to await the reactivation of external power from power bus F 33, 41. In this case, the comparator block A, the delay block B, and the booster block D all power down and their outputs are high impedance. When the charge storage cell E is depleted and the power bus F is down, block I is depowered and the FET(s) are open circuited. If the voltage drop on connection FETs C is stable 43, then power and ground planes are shorted 30. If the voltage drop on connection FETs C is rising 42, the circuit goes into the detect power state 20.

It is believed that the POWER GROUND SHORT CIRCUIT, WITH ADJUSTABLE ACTIVATION DELAY AND ACTIVATION TIME PERIOD of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A circuit for powering down a power bus line by shorting the power bus line to a ground plane, comprising:
   a comparator for comparing a voltage on the power bus line with an internal reference voltage to provide a comparator output signal;
   a delay circuit receiving the comparator output signal and generating a delay circuit output signal, the delay circuit being provided with signals output from a first timer and a second timer, the first timer being activated by the comparator output signal, the first timer controlling how long after a power down signal occurs before a power bus line to a ground plane short is initiated;
   a booster circuit for providing an booster circuit output signal greater in magnitude than the magnitude of the delay circuit output signal;
   a switching circuit which is activated by the booster circuit output signal so as to eliminate latent voltages on the power bus line; and
   a slew rate detector for measuring the voltage across the switching circuit and enabling the comparator.

2. The circuit of claim 1, further comprising an internal voltage source for supplying the internal reference voltage.

3. The circuit of claim 2, wherein the internal voltage source is either a capacitor storage cell or a chemical energy storage cell.

4. The circuit of claim 2, wherein the internal voltage source is electrically connected to the power bus line through a blocking diode.

5. The circuit of claim 1, wherein the second timer is activated by the output from the first timer.

6. The circuit of claim 1, further comprising a pulse width generator associated with the delay circuit, the pulse width generator providing a pulse of a given spacing and a given duration.

7. The circuit of claim 1, wherein the output signal from the first timer is ANDed with the output signal of the second timer.

8. The circuit of claim 7, wherein the output of the second timer is the delay circuit output signal.

9. The circuit of claim 1, wherein the booster circuit is a charge pump.

10. The circuit of claim 1, wherein the switching circuit includes MOSFET transistors.

11. The circuit of claim 10, wherein the MOSFET transistors are arranged in parallel such that their gates receive the booster circuit output signal.

12. The circuit of claim 10, wherein the MOSFET transistors are PMOS FETs.

13. The circuit of claim 10, wherein the MOSFET transistors are NMOS FETs.

14. The circuit of claim 1, wherein the circuit is contained on a single board or chip.

15. The circuit of claim 1, wherein the circuit removes differential line voltages between multiple power lines and a ground.

16. The circuit of claim 1, wherein the circuit removes differential line voltages between a single power line and multiple grounds.

17. The circuit of claim 1, wherein the second timer controls how long the power bus line to ground plane short is maintained.

18. The circuit of claim 1, wherein the switching circuit includes a solid state relay.

19. The circuit of claim 1, wherein the switching circuit includes a mechanical relay.

20. A method for shorting a power bus line to a ground plane, comprising the steps of:
  detecting a power state;
  if power is down, then shorting a power bus line to a ground plane and generating a delay interval or pulse after shorting the power bus line to the ground plane.

21. The method of claim 20, further comprising, during the delay interval, checking an internal power supply and checking the voltage drop on connection FETs after generating a delay interval or pulse.

22. The method of claim 21, wherein, if an FET voltage drop across the connection FETs is a) stable and present or b) falling, then shorting the power bus line and the ground plane and, if the FET voltage drop is rising, then returning to the step of detecting a power state.

23. The method of claim 22, wherein while power is up, charging a charge storage cell of the internal power supply.

24. The method of claim 23, wherein if charge storage cell is depleted, returning to a zero power state.

25. The method of claim 20, wherein the step of checking a power state includes the step of comparing an internal reference voltage with the power bus line voltage and the steps of shorting a power bus line to a ground plane and generating a delay interval or pulse after shorting the power bus line to the ground plane include generating a power fault signal if the difference between the internal reference voltage and the power bus line voltage exceeds a threshold.

26. The method of claim 25, the steps of shorting a power bus line to a ground plane and generating a delay interval or pulse after shorting the power bus line to the ground plane further including
  generating a time delay or pulse signal as a result of the power fault signal after generating a power fault signal;
  generating a boosted signal as a result of the time delay or pulse signal; and
  activating a switch to drive the power bus line to ground after generating a boosted signal.

27. A circuit for powering down a power bus line, comprising:
  a comparator for comparing the voltage on the power bus line with an internal reference voltage to provide a comparator output signal;
  a delay circuit receiving the comparator output signal and generating a delay circuit output signal, the delay circuit being provided with signals output from a first timer and a second timer, the first timer being activated by the comparator output signal, wherein the output from the first timer is ANDed with the output signal of the second timer;
  a booster circuit for providing an booster circuit output signal greater in magnitude than the magnitude of the delay circuit output signal;
  a switching circuit which is activated by the booster circuit output signal so as to eliminate latent voltages on the power bus line; and
  a slew rate detector for measuring the voltage across the switching circuit and enabling the comparator.

28. The circuit of claim 27, further comprising an internal voltage source for supplying the internal reference voltage, the internal voltage source being a capacitor storage cell.

29. The circuit of claim 27, further comprising an internal voltage source for supplying the internal reference voltage, the internal voltage source being a chemical energy storage cell.

30. The circuit of claim 27, wherein the booster circuit is a charge pump.

31. A circuit for powering down a power bus line, comprising:
  a comparator for comparing the voltage on the power bus line with an internal reference voltage to provide a comparator output signal;
  a delay circuit receiving the comparator output signal and generating a delay circuit output signal;
  a booster circuit for providing an booster circuit output signal greater in magnitude than the magnitude of the delay circuit output signal;
  a switching circuit which is activated by the booster circuit output signal so as to eliminate latent voltages on the power bus line, wherein the switching circuit includes MOSFET transistors, the MOSFET transistors being arranged in parallel such that their gates receive the booster circuit output signal; and
  a slew rate detector for measuring the voltage across the switching circuit and enabling the comparator.

32. The circuit of claim 31, further comprising an internal voltage source for supplying the internal reference voltage, the internal voltage source being a capacitor storage cell.

33. The circuit of claim 31, further comprising an internal voltage source for supplying the internal reference voltage, the internal voltage source being a chemical energy storage cell.

34. The circuit of claim 31, wherein the booster circuit is a charge pump.

35. A circuit for powering down a power bus line, comprising:
  a comparator for comparing the voltage on the power bus line with an internal reference voltage to provide a comparator output signal;
  a delay circuit receiving the comparator output signal and generating a delay circuit output signal;
  a booster circuit for providing an booster circuit output signal greater in magnitude than the magnitude of the delay circuit output signal;
  a switching circuit which is activated by the booster circuit output signal so as to eliminate latent voltages on the power bus line; and
  a slew rate detector for measuring the voltage across the switching circuit and enabling the comparator,
  wherein the circuit for powering down the power bus line removes differential line voltages between multiple power bus lines and a ground plane.

36. The circuit of claim 35, further comprising an internal voltage source for supplying the internal reference voltage, the internal voltage source being a capacitor storage cell.

37. The circuit of claim 35, further comprising an internal voltage source for supplying the internal reference voltage, the internal voltage source being a chemical energy storage cell.

38. The circuit of claim 35, wherein the booster circuit is a charge pump.

39. A circuit for powering down a power bus line, comprising:
  a comparator for comparing the voltage on the power bus line with an internal reference voltage to provide a comparator output signal;
  a delay circuit receiving the comparator output signal and generating a delay circuit output signal;
  a booster circuit for providing an booster circuit output signal greater in magnitude than the magnitude of the delay circuit output signal;
  a switching circuit which is activated by the booster circuit output signal so as to eliminate latent voltages on the power bus line; and a slew rate detector for measuring the voltage across the switching circuit and enabling the comparator, wherein the circuit for powering down the power bus line removes differential line voltages between the power bus line and multiple ground planes.

40. The circuit of claim 39, further comprising an internal voltage source for supplying the internal reference voltage, the internal voltage source being a capacitor storage cell.

41. The circuit of claim 39, further comprising an internal voltage source for supplying the internal reference voltage, the internal voltage source being a chemical energy storage cell.

42. The circuit of claim 39, wherein the booster circuit is a charge pump.

* * * * *